(12) United States Patent
Wang (10) Patent No.: US 10,035,703 B2
(45) Date of Patent: Jul. 31, 2018

(54) DIE BOND DESIGN FOR MEDIUM PRESSURE SENSOR

(71) Applicant: Continental Automotive Systems, Inc., Auburn Hills, MI (US)

(72) Inventor: Joe Pin Wang, Long Grove, IL (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 751 days.

(21) Appl. No.: 14/040,167

(22) Filed: Sep. 27, 2013

(65) Prior Publication Data

US 2015/0091107 A1    Apr. 2, 2015

(51) Int. Cl.
*H01L 29/84* (2006.01)
*B81C 3/00* (2006.01)
*G01L 19/14* (2006.01)

(52) U.S. Cl.
CPC .............. *B81C 3/007* (2013.01); *B81C 3/005* (2013.01); *G01L 19/148* (2013.01); *B81B 2201/0264* (2013.01); *B81C 2203/054* (2013.01); *B81C 2203/055* (2013.01); *H01L 29/84* (2013.01)

(58) Field of Classification Search
CPC .............. H01L 2924/1461; H01L 29/84; H01L 2224/48145; H01L 2224/49109; H01L 2924/15151; H01L 41/08; G01L 9/0042; G01L 9/0054; G01L 19/147; G01L 19/143; G01L 19/141
See application file for complete search history.

(56) References Cited

U.S. PATENT DOCUMENTS

| 5,637,801 A | 6/1997 | Ichihashi |
| 6,060,776 A * | 5/2000 | Spitz ..................... H01L 23/049 257/678 |
| 2005/0172724 A1* | 8/2005 | Sakai ..................... G01L 9/0054 73/754 |
| 2006/0000265 A1* | 1/2006 | Parker ..................... F01N 3/021 73/114.76 |
| 2006/0288793 A1* | 12/2006 | Tanaka ................ G01L 19/0627 73/754 |
| 2010/0122583 A1 | 5/2010 | Rozgo et al. |
| 2012/0090173 A1 | 4/2012 | Jiao |
| 2012/0313190 A1 | 12/2012 | Goel et al. |

FOREIGN PATENT DOCUMENTS

| CN | 101900625 A | 12/2010 |
| CN | 102815660 A | 12/2012 |
| CN | 103155727 A | 6/2013 |
| JP | 2013003112 A | 1/2013 |

OTHER PUBLICATIONS

Search Report dated Jun. 26, 2014, from corresponding GB Patent Application No. GB1320689.1.
CN Office Action dated Jul. 27, 2017 including English translation of corresponding Chinese patent application CN 201410500813.7.

* cited by examiner

*Primary Examiner* — Sue A Purvis
*Assistant Examiner* — Leslie Pilar Cruz (57) ABSTRACT

A micro-electromechanical pressure transducer formed from a silicon die centers itself on a pedestal, formed from either a metal or a dielectric, by applying a predetermined amount of liquid epoxy adhesive to the square, top surface of the pedestal and allowing the liquid adhesive to distribute itself over the top surface. A MEMS die placed atop the liquid adhesive is centered on the top surface by surface tension between sides of the die and the top surface.

10 Claims, 7 Drawing Sheets

DIE BOND DESIGN FOR MEDIUM PRESSURE SENSOR

BACKGROUND

Silicon-based micro-sensors use so-called MEMS (micro-electromechanical systems) technology to achieve low cost and high performance. One such a device is a MEMS pressure sensor, which is comprises a small, thin silicon diaphragm onto which a piezoresistive circuit, normally a Wheatstone bridge, is formed. Diaphragm stresses caused by pressure applied to the diaphragm change the resistance values of the piezoresistors in the bridge circuit. An electronic circuit detects the resistance changes of the piezoresistive bridge circuit and outputs an electrical signal representative of the applied pressure. One such device is the "Differential Pressure Sensor Device" disclosed in U.S. Pat. No. 8,466,523, the content of which is incorporated herein by reference.

In order to sense the pressure of a liquid or gas, both of which are fluids, the fluid's pressure needs to be applied to the silicon diaphragm. Applying a fluid's pressure to a silicon diaphragm is usually accomplished using a port or hole formed into a spacer to which the silicon die having the piezoresistors is attached. Precise alignment of the port or hole through the spacer is thus important. As micro-sensors get smaller, however, assembling them so that their structures are properly aligned with each other keeps getting more challenging. A bond or connection, formed between a MEMS silicon die and a spacer or pedestal, which will automatically align the silicon die onto the spacer or pedestal would be an improvement over the prior art.

BRIEF SUMMARY

Embodiments of the invention are directed to a micro-electromechanical pressure transducer formed from a silicon die centers itself on a pedestal, formed from either a metal or a dielectric, by applying a predetermined amount of liquid epoxy adhesive to the square, top surface of the pedestal and allowing the liquid adhesive to distribute itself over the top surface. A MEMS die placed atop the liquid adhesive is centered on the top surface by surface tension between sides of the die and the top surface.

DETAILED DESCRIPTION

As used herein, a right-rectangular prism is a convex polyhedron bounded by six quadrilateral faces. The quadrilateral faces can be either rectangles or squares.

Figure 1A:
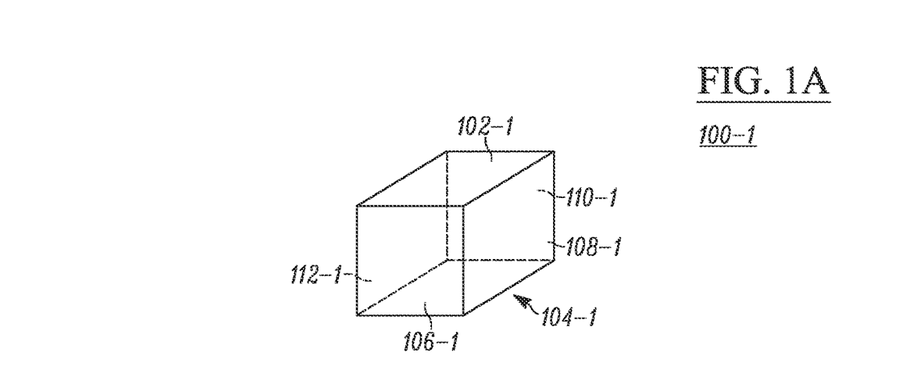
FIGS. 1A-1C are perspective views of examples of right-rectangular prisms.

FIG. 1A is a perspective view of one embodiment of a right-rectangular prism 100-1, the six faces of which are squares. The prism 100-1 has a top surface 102-1, an opposing bottom surface 104-1 and four side surfaces 106-1, 108-1, 110-1, and 112-1. Since the exterior surfaces are squares, the right-rectangular prism 100-1 shown in FIG. 1A is a cube.

Figure 1B:
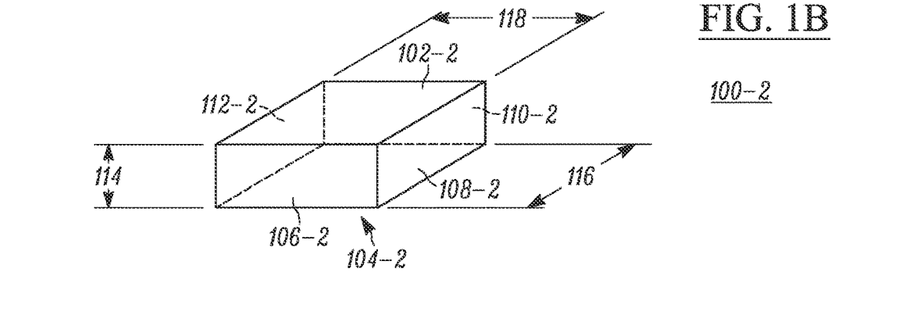

FIG. 1B depicts another embodiment of a right-rectangular prism 100-2. It's top and bottom surfaces 102-2 and 104-2 are squares, but the side surfaces 106-2, 108-2, 110-2, and 112-2 are rectangles. The side surface height dimension 114 is less than the side surface width dimension 116. The height dimension 114 is also less than the depth dimension 118 of the prism 100-2.

Figure 1C:
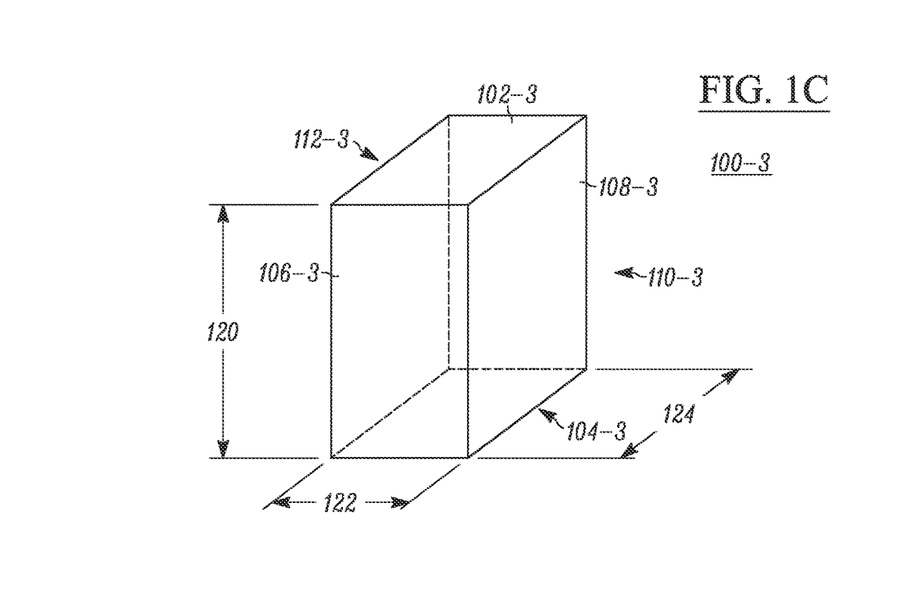

FIG. 1C is another embodiment of a right-rectangular prism 100-3. It too has a top surface 102-3, an opposing bottom surface 104-3, but the top and bottom surfaces are rectangles. Unlike the prisms 100-1 and 100-2 shown in FIG. 1A and 1 B, however, the right-rectangular prism 100-3 shown in FIG. 1C is taller than its length or width. Its side surface height dimension 120 is greater than its side surface width 124 and its depth 122.

Figure 1D:
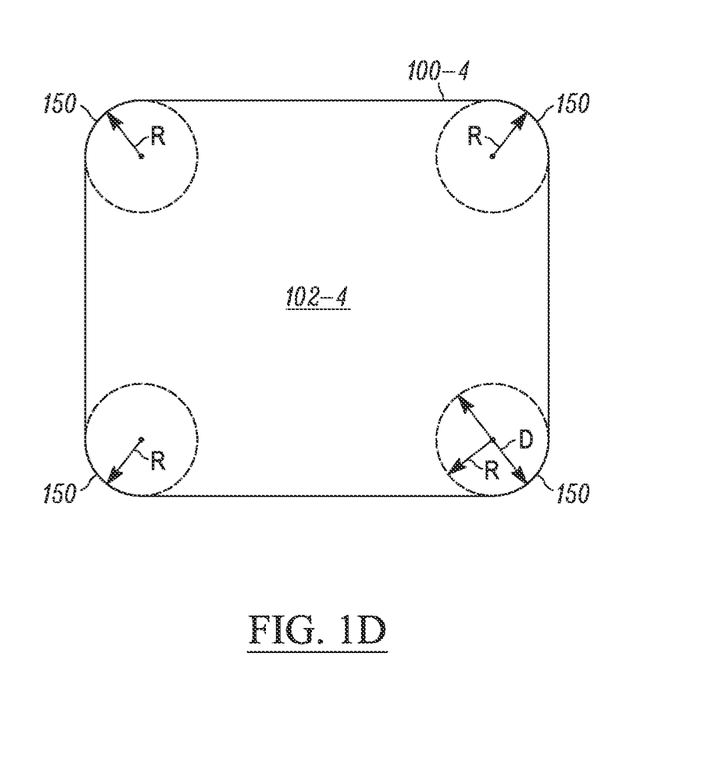
FIG. 1D is a top view of a right-rectangular prism, vertical corners of which are provided with a radius.

FIG. 1D shows the top surface 102-4 of another embodiment of a right-rectangular prism 100-4. In FIG. 1D, the vertically-oriented corners 150 are rounded over and have a radius of curvature R.

Figure 2:
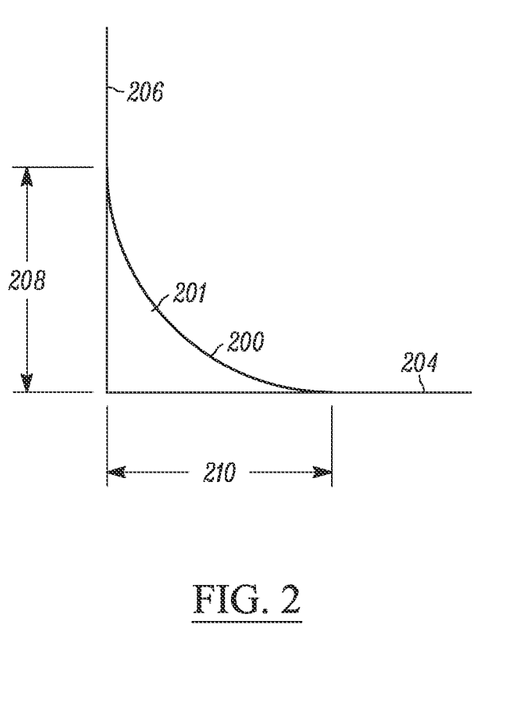
FIG. 2 is a cross section of the curved upper surface of a column of liquid, also known as a meniscus and which is also referred to herein as a fillet.

FIG. 2 is a cross-sectional view of a typical fillet 200, which is a curved upper surface of a volume of liquid 201 formed when the volume or liquid 201 contacts two surfaces 204 and 206. The fillet 200 has a vertical height 208 and a horizontal width 210. The height 208 and the width 210 depend on the viscosity of the liquid 201, its surface tension, as well as the surface roughness and wetability of the two surfaces 204 and 206.

Figure 3:
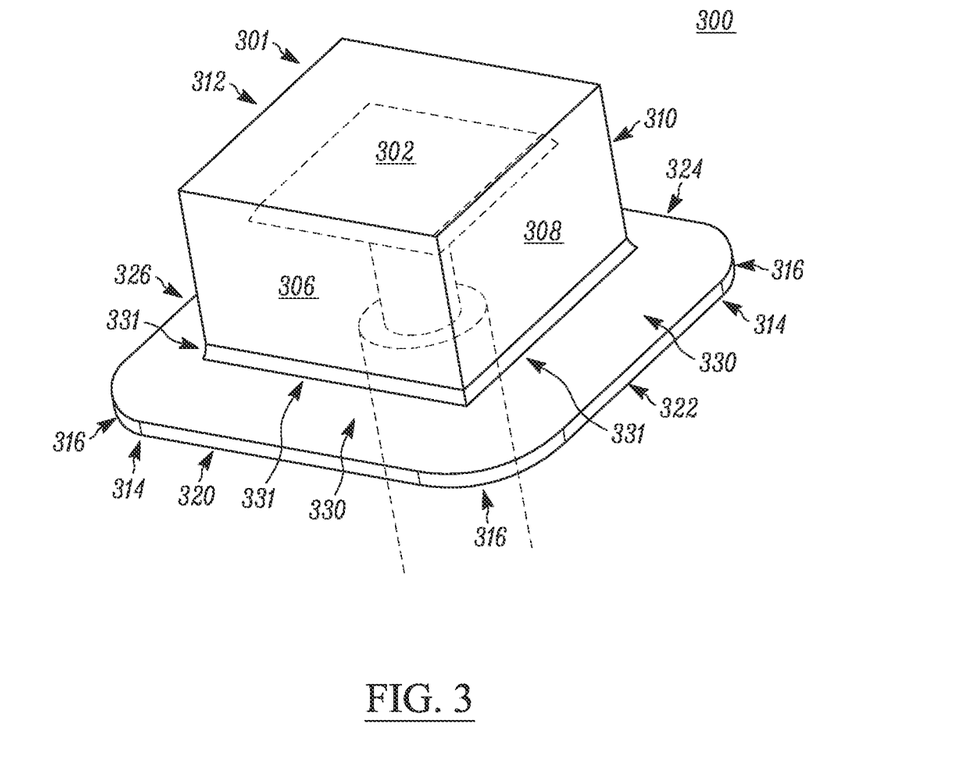
FIG. 3 is a perspective view of a MEMS pressure sensor.
Figure 4:
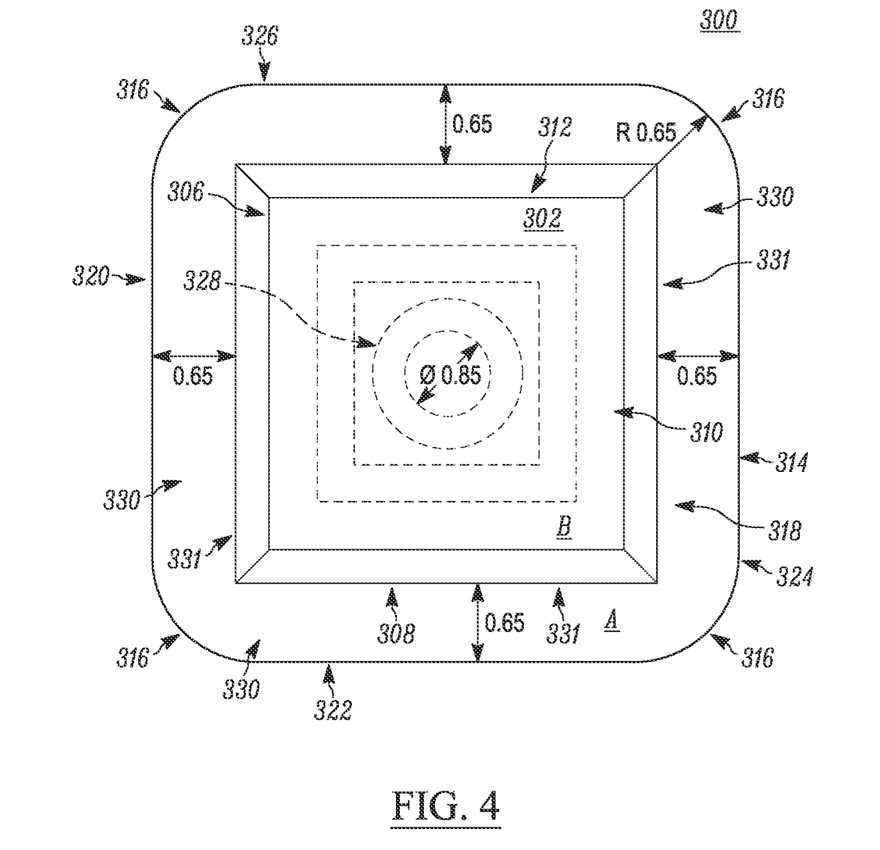
FIG. 4 is a top view of the sensor shown in FIG. 3.
Figure 5:
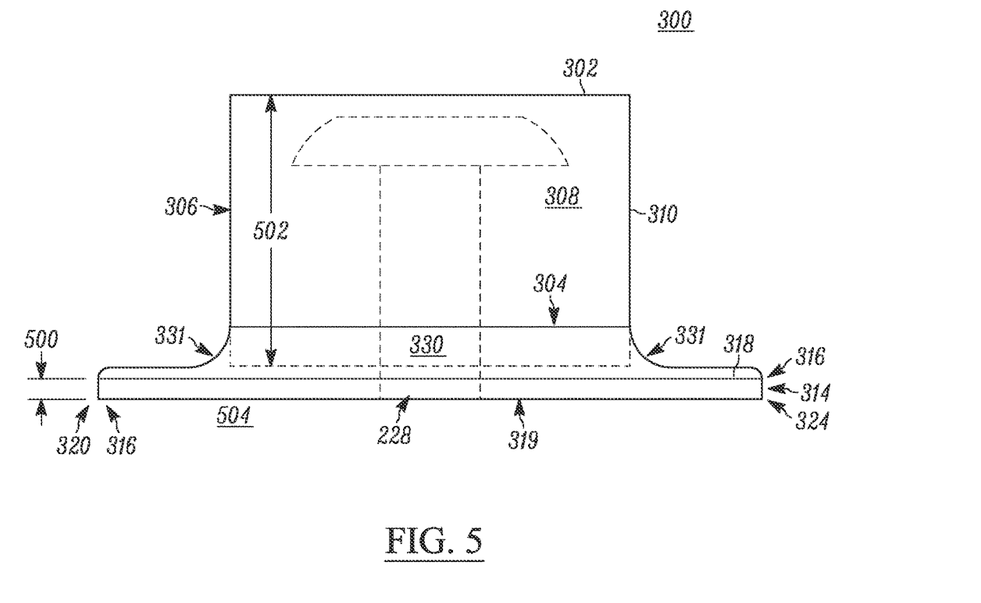
FIG. 5 is a cross sectional view of the sensor shown in FIG. 3.

FIG. 3 is a perspective view of a pressure sensor 300. FIG. 4 is a top view of the pressure sensor 300. FIG. 5 is a cross-sectional view of the sensor 300.

The sensor 300 comprises a micro-electro-mechanical system (MEMS) pressure sensor semiconductor die 301, referred to hereafter as a MEMS sensor die 301, the shape of which is essentially a right-rectangular prism. The MEMS sensor die 301 has a top surface 302, an opposing bottom surface 304, and four vertical side surfaces 306, 308, 310, and 312.

The MEMS sensor die 301 is attached to a comparatively thin pedestal 314 by way of a die bond 330, which will automatically center the MEMS sensor die 301 on the pedestal 314. The shape of the pedestal 314 is also a right-rectangular prism, however, the corners 316 on its substantially planar top surface 318 are preferably rounded as explained below. The pedestal 314 has four, substantially vertical side surfaces 320, 322, 324, and 326.

The pedestal 314 is preferably a dielectric but it can also be formed of a metal. In the preferred embodiment, however, the pedestal is a plastic and is formed by molding a trench around and into the material that forms a substrate for the pressure sensor. In a preferred embodiment, the pedestal 314 has a vertical height of about 0.1 millimeters. In alternate embodiments, however, the height of the pedestal 314 is increased to provide additional stress isolation of the MEMS die from a substrate on which the pedestal is attached or from which the pedestal is formed. The pedestal is thus considered to be a stress isolator for the MEMS die.

The pedestal 314 is formed with a through hole 328, which is centered in the top surface 318 and centered in the bottom surface 319 of the pedestal. The hole 328 extends completely through the top surface 318 and the bottom surface 319 and thus provides a passage way through the pedestal, through which fluids (liquids and gases) can readily pass and exert force on a diaphragm formed in the top surface 302 of the MEMS sensor die 301.

The top surface 318 of the pedestal 314 "faces" the bottom surface 304 of the MEMS sensor die 301 but the two surfaces 318 and 304 do not engage or contact each other. The MEMS sensor die 301 is embedded in an epoxy adhesive and its bottom surface 304 is separated from the top surface 318 of the pedestal 314 by a short distance that is equal to the thickness of the die bonding adhesive layer, also known as a die bond layer 330, which is located between them.

In order for the MEMS die 301 to automatically align itself with the center of the top surface 318 of the pedestal 314, the surface area "A" of the top surface 318 of the pedestal 314 should be greater than the area B of the bottom surface 304 of the MEMS sensor die 301, as can be seen in FIG. 4. In a preferred embodiment, as can be seen in FIG. 4, each side of the MEMS die 301 is about two millimeters in length. Each side surface of the pedestal is about 0.65 millimeters away from the side surfaces of the MEMS sensor die 301. The liquid epoxy having a viscosity of about 6500 centipoise was able to form uniform-size fillets on all four sides of the MEMS die 301. It was also determined that the corners 316 of the top surface 318 of the pedestal should be rounded in order to facilitate distribution of liquid adhesive around the MEMS sensor die 301 and thereby help the formation of fillets of uniform size.

Between the MEMS sensor die 301 and the pedestal 314 is the previously mentioned die bond layer 330, best seen in FIG. 5, which is also referred to herein as a bonding layer 330 and die bond 330. The die bond 330 is a layer of a hardened epoxy, also referred to herein as being a cured epoxy. In its pre-cured liquid state, the epoxy has a viscosity, which is preferably about 6500 centipoise. The pre-cured, liquid epoxy is applied to the top surface 318 of the pedestal 314.

The volume of liquid epoxy applied to the top surface 318 should be predetermined, i.e., determined before it is applied to the top surface 318 of the pedestal 314. The volume of liquid adhesive should be just enough to be able to flow over the entire area A, of the top surface 318 but not spill into the through hole 328. The amount of liquid epoxy that is applied will thus depend on the area A, of the top surface 318, the roughness of the top surface 318, and the viscosity of the particular liquid adhesive being used. A through hole 328 in the pedestal, which becomes plugged or even partially blocked with epoxy during assembly because too much epoxy was applied to the top surface 318 of the pedestal 314, will render the pressure sensor 300 inoperative.

Almost immediately after the liquid epoxy is applied to the top surface 318 of the pedestal 314, the MEMS sensor die 301 is placed onto the liquid. When the MEMS sensor die 301 is placed on top of the liquid epoxy, it will start to sink into the liquid adhesive. As the MEMS sensor die 301 sinks, surface tension of the liquid epoxy causes the liquid to adhere to, i.e., wet, the vertical side surfaces 306, 308, 310, 312 of the MEMS sensor die 301 as well as the horizontal top surface 318 of the dielectric pedestal 314.

As the MEMS sensor sinks into the liquid adhesive, surface tension causes fillets 331 to form on each of the side surfaces 306, 308, 310, 312 of the MEMS sensor die 301 and horizontally across the top surface 318 of the pedestal 314. If the fillets 331 formed on opposite sides of the MEMS sensor die 301 are not the same size, a larger fillet 331 on one side will exert a tensile force on its side of the die that is greater than the tensile force exerted on the opposite side of the MEMS sensor die 301. A greater tensile force exerted by a larger fillet 331 on one side of the die 301 tends to pull the MEMS sensor die 301 in the direction of the larger fillet 331, opening up area on the top surface 318 of the pedestal 314, which allows more liquid adhesive to flow over the opened area, which also provides more liquid adhesive to equalize the size of the fillets 331 until the fillets equalize due to the force exerted by the fillets on the opposite sides becoming equal in magnitude but in opposite directions. Since the top surface 318 of the pedestal 314 is square and since the bottom surface 304 of the MEMS sensor die 301 is also square, liquid adhesive will eventually distribute itself evenly across the top surface 318 of the pedestal 314 to form equal-size fillets 331 against each side of the MEMS sensor die 301. After the liquid adhesive has distributed itself evenly across the top surface 318 of the pedestal 314 and around the vertical side surfaces 306, 308, 310, and 312 of the MEMS sensor die 301, the equal-sized fillets 331 will exert equal magnitude but opposite-direction forces on opposing surfaces of the pedestal. Such forces will urge the MEMS sensor die 301 to the exact center of the pedestal.

In a preferred embodiment, the fillets 331 are preferably symmetrical in order to reduce bonding stress exerted on the MEMS sensor die 301 by the cured adhesive, which is quite rigid. To make the fillets 331 symmetrical, the area of the top surface 318 of the pedestal 314, the volume of the liquid adhesive applied to the top surface 318 of the pedestal 314, its viscosity and wetability of the MEMS sensor die and pedestal surfaces are preferably selected such that, when the MEMS sensor die 301 is placed into the liquid adhesive, the fillets 331 will extend upwardly on the side surfaces 306, 308, 310, and 312 of the MEMS sensor die 301, by a vertical distance that is equal to the distance that the fillets extend horizontally across the top surface 318 of the pedestal 314 from the side surfaces of the MEMS sensor die 301 to the side surfaces 320, 322, 324, 326 of the pedestal 314.

Those of ordinary skill in the art will recognize that the pressure sensor 300 comprising the MEMS sensor die 301, the die bond layer 330 and the pedestal 314 will usually be mounted on some other surface made of a material that differs from the pedestal material. When so mounted, the pedestal height can be increased to reduce thermally-induced stress on the MEMS sensor die.

As shown in FIG. 5, the pedestal height 500 is relatively short, i.e., about 0.1 millimeter, as compared to the height 502 of the MEMS sensor die 301. When the pressure sensor 300 is mounted on a plastic substrate 504, differences in thermal expansion coefficients can cause thermally-induced stress on the pedestal 314 by the substrate 504 to be transmitted to the MEMS sensor die 301. In alternate embodiments, the pedestal height 500 is increased as needed in order to provide more isolation of the MEMS sensor die 301 from thermally-induced stresses on the pedestal and thereafter on the MEMS sensor die 301.

In a preferred embodiment, the vertically-oriented corners formed by adjacent vertical faces of the pedestal should be rounded to insure that the radii of the fillets 331 are uniform. FIG. 1D is a view of the top surface 102-4 of a right-rectangular prism 100-4 having vertical corners 150 that are formed to have a radius, R. FIG. 1D thus depicts the top surface of a pedestal the vertically-oriented corners of which are rounded to have a radius. In a preferred embodiment, the radius of the rounded corners 316 of a pedestal 314 should be substantially equal to the horizontal width 210 of a fillet 200 of liquid adhesive.

Figure 6:
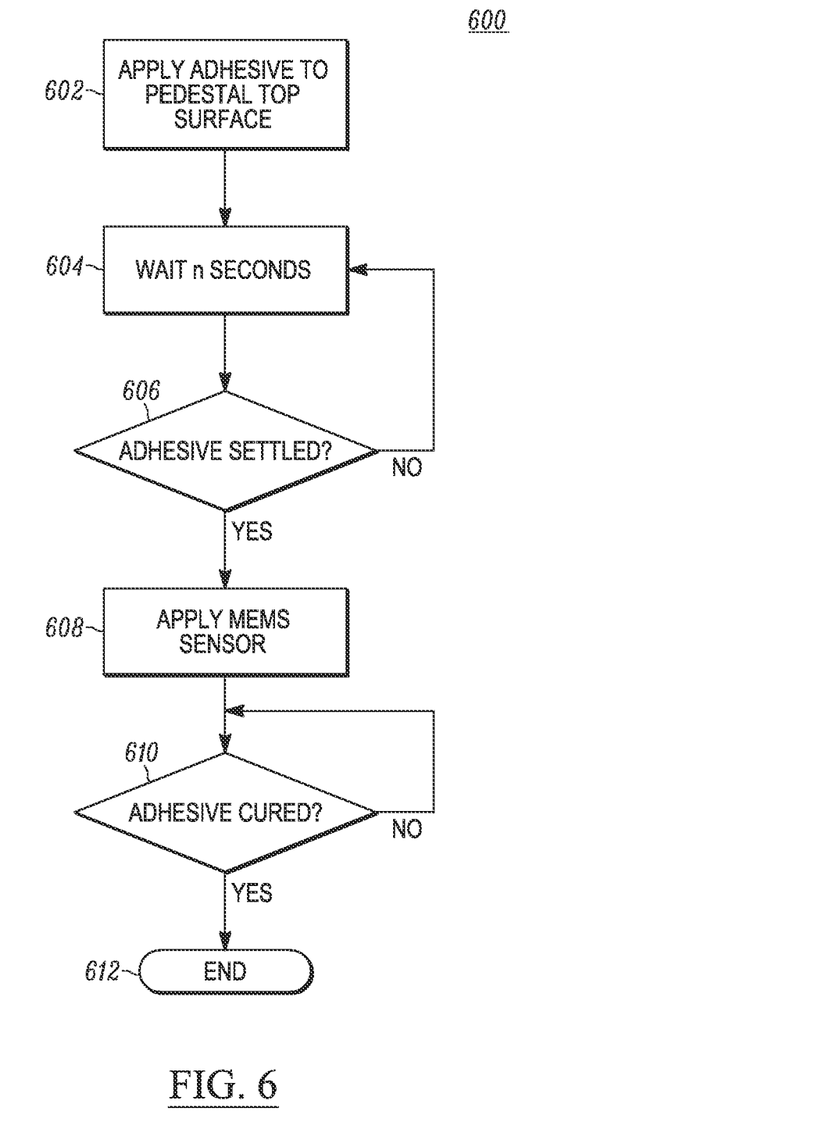
FIG. 6 is a flow chart, showing steps of a method of attaching a MEMS die to a pedestal.

FIG. 6 is a flowchart of a method 600 of assembling a pressure sensor. In a first step 602, a predetermined amount of a predetermined adhesive is applied to the top surface of a plastic pedestal, the amount being determined to just cover the top surface of a pedestal. In steps 604 and 606, the method waits for a predetermined amount of time until the liquid adhesive has settled itself across the top surface of the pedestal. A MEMS sensor die is applied at step 608, which is followed by a "wait" time in step 610, during which the liquid adhesive cures to hardness.

By properly sizing the right-rectangular prisms so that the lower prism is just slightly larger than the upper prism and by properly sizing the amount of adhesive and selecting an adhesive with the proper viscosity, a MEMS sensor applied to liquid adhesive on the top of a pedestal will cause the MEMS sensor to center itself on the pedestal's top surface. After the epoxy cures, the resultant structure can be attached to a circuit board or onto a housing after the epoxy cures. The through hole through the pedestal will be automatically centered with the through hole in the MEMS sensor by the surface tension of the liquid adhesive as exerted on the sides of the MEMS sensor.

The foregoing description is for purposes of illustration only. The scope of the invention is defined by the following claims.

The invention claimed is:

1. A pressure sensor comprising:
a micro-electromechanical pressure transducer (MEMS sensor) comprising:
a first, substantially right-rectangular prism made of silicon having four, substantially vertical and substantially rectangular sides and substantially square and opposing top and bottom surfaces, the top and bottom surfaces of the first prism having four substantially equal-length sides with a first length dimension, the top and bottom surfaces having a corresponding first area, the top surface also defining a diaphragm, which deflects responsive to a pressure applied to the diaphragm, the first prism also having a first hole through the bottom surface and which extends through the first prism to an open space below the diaphragm;
a pedestal formed from a second, substantially right-rectangular prism having four, substantially vertical and substantially rectangular sides and substantially square and opposing top and bottom opposing surfaces, the top and bottom surfaces of the second prism having four, substantially equal length sides with a second length dimension and a corresponding second area, the second length dimension being greater than the first length dimension, the second area also being greater than the first area, the substantially square top surface of the pedestal having four vertically-oriented, rounded corners, the second prism also having a second hole, which extends through the second prism and its top and bottom surfaces, the second hole being aligned with the first hole; and
a die bond layer located between said top side of the second prism and the bottom surface of the first prism, the die bond layer being formed from a predetermined volume of a liquid adhesive, which hardens by curing, the liquid adhesive having a predetermined viscosity prior to curing, the adhesive also having a surface tension, the liquid adhesive being selected such that surface tension of the liquid adhesive causes the predetermined volume of liquid to distribute itself evenly around the second hole, and wherein the four vertically-oriented, rounded corners are configured to facilitate distribution of the liquid adhesive around the first prism;
wherein the first and second areas, the predetermined volume, and the viscosity are selected, and the rounded corners are configured, such that the predetermined volume of liquid adhesive forms four, substantially equal-size fillets, which are attached to the sides of the first prism and attached to the top surface of the second prism, a fillet being a concave-shaped accumulation of liquid adhesive attached to a side of the first prism and, the top surface of the second prism.

2. The pressure sensor of claim 1, wherein the pedestal is formed from a dielectric material.

3. The pressure sensor of claim 1, wherein the pedestal is metallic.

4. The pressure sensor of claim 1, wherein a rounded corner of the pedestal has a first radius of curvature and the fillets of liquid adhesive have a second radius of curvature.

5. The pressure sensor of claim 1, wherein a rounded corner has a first radius of curvature and the fillets have a vertical height dimension and a horizontal width dimension.

6. The pressure sensor of claim 4, wherein the first radius of curvature and the second radius of curvature are substantially equal.

7. The pressure sensor of claim 4, wherein the first radius of curvature of a corner and the width dimension of a filet are substantially equal.

8. The pressure sensor of claim 1, wherein the liquid adhesive wets sides of the first prism and wets the top surface of the second prism.

9. A pressure sensor comprising:
a micro-electromechanical pressure transducer (MEMS sensor) comprising:
a first, substantially right-rectangular prism made of silicon having four, substantially vertical and substantially rectangular sides and substantially square and opposing top and bottom surfaces, the top and bottom surfaces of the first prism having four substantially equal-length sides with a first length dimension, the top and bottom surfaces having a corresponding first area, the top surface also defining a diaphragm, which deflects responsive to a pressure applied to the diaphragm, the first prism also having a first hole through the bottom surface and which extends through the first prism to an open space below the diaphragm;
a pedestal formed from a second, substantially right-rectangular prism having four, substantially vertical and substantially rectangular sides and substantially square and opposing top and bottom opposing surfaces, the top and bottom surfaces of the second prism having four, substantially equal length sides with a second length dimension and a corresponding second area, the second length dimension being greater than the first length dimension, the second area also being greater than the first area, the second prism also having a second hole, which extends through the second prism and its top and bottom surfaces, the second hole being aligned with the first hole; and
a die bond layer located between said top side of the second prism and the bottom surface of the first prism, the die bond layer being formed from a predetermined volume of a liquid adhesive, which hardens by curing, the liquid adhesive having a predetermined viscosity prior to curing, the adhesive also having a surface tension, the liquid adhesive being selected such that surface tension of the liquid adhesive causes the predetermined volume of liquid to distribute itself evenly around the second hole;

wherein the first prism side lengths are about 2 millimeters, the second prism side lengths are about 3.25 millimeters and the liquid adhesive is an epoxy having a viscosity of about 6500 centipoise (CPS), whereby surface tension of the liquid adhesive aligns the center the first prism with the center of the second prism.

10. The pressure sensor of claim 9, wherein the first and second holes are aligned with each other by the filets.

* * * * *